(12) United States Patent
Lopatin

(10) Patent No.: US 6,420,189 B1
(45) Date of Patent: Jul. 16, 2002

(54) SUPERCONDUCTING DAMASCENE INTERCONNECTED FOR INTEGRATED CIRCUIT

(75) Inventor: Sergey Lopatin, Santa Clara, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/844,845

(22) Filed: Apr. 27, 2001

(51) Int. Cl.[7] .................. H01L 21/00; H01L 23/52
(52) U.S. Cl. ................................ 438/2; 257/758
(58) Field of Search .................... 438/2, 618, 622, 438/625, 627, 637, 642, 643, 652, 653, 678; 257/622, 737, 741, 750, 751, 752, 753, 758, 761, 762, 773, 774, 784; 505/191, 220, 330, 413, 475

(56) References Cited

U.S. PATENT DOCUMENTS

| | | | |
|---|---|---|---|
| 5,183,800 A | * | 2/1993 | Nakagawa |
| 5,439,780 A | | 8/1995 | Joshi et al. |
| 5,593,918 A | * | 1/1997 | Rostoker et al. |
| 5,659,201 A | | 8/1997 | Wollesen |
| 5,811,375 A | | 9/1998 | Nakamura et al. |
| 5,900,668 A | | 5/1999 | Wollesen |
| 6,016,000 A | * | 1/2000 | Moslehi |
| 6,042,998 A | | 3/2000 | Brueck et al. |
| 6,071,809 A | | 6/2000 | Zhao |
| 6,083,842 A | | 7/2000 | Cheung et al. |
| 6,096,641 A | | 8/2000 | Kunikiyo |
| 6,103,624 A | | 8/2000 | Nogami et al. |
| 6,124,198 A | * | 9/2000 | Moslehi |
| 6,127,263 A | | 10/2000 | Parikh |
| 6,133,051 A | | 10/2000 | Hintermaier et al. |
| 6,144,096 A | | 11/2000 | Lopatin |
| 6,144,099 A | | 11/2000 | Lopatin et al. |
| 6,157,081 A | | 12/2000 | Nariman et al. |
| 6,174,799 B1 | | 1/2001 | Lopatin et al. |

* cited by examiner

*Primary Examiner*—Keith Christianson
(74) *Attorney, Agent, or Firm*—Renner, Otto, Boisselle & Sklar, LLP

(57) ABSTRACT

A method of forming a superconducting damascene interconnect structure, and the structure made thereby, the method includes forming a cavity in an interlevel dielectric; forming a barrier layer in the cavity; forming a seed layer in the cavity over the barrier layer; filling the cavity by electrodepositing a Y—Ba—Cu alloy; and annealing in oxygen flow to form a Y—Ba—Cu—O superconductor on the barrier layer. In one embodiment, the superconductor has a formula $YBa_2Cu_3O_{7-x}$, wherein $x \leq 0.5$. In another embodiment, the method includes forming a cavity in an interlevel dielectric; forming a Y—Ba—Cu alloy layer in the cavity; forming a seed layer in the cavity over the Y—Ba—Cu alloy layer; filling the cavity by electrodepositing a Y—Ba—Cu alloy fill; and annealing in oxygen flow to form a Y—Ba—Cu—O superconductor on the dielectric.

20 Claims, 9 Drawing Sheets

US 6,420,189 B1

SUPERCONDUCTING DAMASCENE INTERCONNECTED FOR INTEGRATED CIRCUIT

FIELD OF THE INVENTION

The present invention relates to a semiconductor device comprising a superconductor damascene interconnect, and a method of manufacturing the semiconductor device. The invention has particular applicability in manufacturing high density semiconductor devices with deep submicron design features which require low RLC delay interconnections between active devices.

BACKGROUND ART

Current demands for high density and performance associated with ultra large scale integration (ULSI) require submicron features of significantly less than 0.25 microns, increased transistor and circuit speeds and improved reliability. As feature size decreases, the sizes of the resulting transistors as well as those of the interconnects between transistors also decrease. Fabrication of smaller transistors allows more transistors to be placed on a single monolithic substrate, thereby allowing relatively large circuit systems to be incorporated on a single, relatively small die area. This trend toward reduced feature sizes imposes severe demands on many aspects of IC fabrication, including interconnect formation. In the manufacture of integrated circuits, after the individual devices, such as the transistors, have been fabricated in the silicon substrate, they must be connected together to perform the desired circuit functions. The connections are commonly referred to as interconnects. Narrower interconnects have reduced cross-sectional area, which results in a higher interconnect resistance for a given interconnect material. This interconnect resistance, along with the capacitance of the interconnect with respect to ground and other interconnects, contributes to an RLC (resistive-inductive-capacitive) time constant which characterizes delays associated with propagation along the interconnect line. Fabrication of a circuit with increased RLC time constants lowers the speed at which the circuit can operate by increasing the time needed, for example, for a circuit output voltage to respond to a change in input voltage. Although there are other parasitic resistances and capacitances in an integrated circuit, such as those associated with the transistors themselves, in modem circuits having submicron feature sizes interconnects may contribute as much as 80% of the total circuit delay time. The increased interconnect resistance described above places a limit on how narrow interconnect lines can be and maintain tolerable interconnect resistance. The greater the resistivity of the interconnect material, the wider the lines must be, as discussed further below. As feature size decreases and transistor density increases, multiple layers of interconnect must be used to connect the transistors to each other and to the terminals of the integrated circuit. The limitation discussed above on the narrowness of interconnect lines can exacerbate this need for multiple interconnect layers. Fabrication of each interconnect layer requires deposition and patterning processes, adding to the expense of the circuit and increasing the opportunity for defect incorporation and the resulting yield reduction. It is therefore desirable to minimize the number of interconnect layers required.

Lowering the resistivity of the interconnect material alleviates many of the interconnect-related problems discussed above. Resistance, R, along the length of a structure formed from a given material is related to the resistivity, $\rho$, of the material by $R=\rho l/A$, where 1 is the length of the structure and A is its cross-sectional area. It can therefore be seen that lowering the resistivity of an interconnect material reduces the resistance of an interconnect line of a given cross-sectional area. Furthermore, a line formed from a lower-resistivity material could be made narrower before an unacceptable resistance level is reached than a line formed from a higher-resistivity material. This ability to form narrower lines may allow fewer interconnect levels to be used to form the required connections for an IC, thereby reducing costs and potentially increasing the yield of correctly-functioning circuits.

Advantages such as those described above of low-resistivity interconnect materials have driven a movement in the semiconductor industry toward replacing aluminum interconnects with interconnects made from copper. The resistivity of pure copper (about $1.7\mu\Omega\cdot$cm) is significantly lower than that of pure aluminum (about $2.6\mu\Omega\cdot$cm). Both aluminum and copper interconnects typically contain small concentrations of other elements to improve interconnect reliability. These added elements increase the resistivity of the metal, but practical copper interconnects still have resistivities up to 40% lower than those of practical aluminum interconnects. Copper interconnects can therefore be made narrower than aluminum interconnects for a given value of interconnect resistance. This may result in fewer levels of metallization being needed with copper interconnects. For a given interconnect cross-sectional area, copper interconnects exhibit lower resistances, and therefore shorter interconnect-related delays, than do aluminum interconnects.

Because copper is more difficult to etch than aluminum, in addition to difficulties in etching narrow features in metals in general as compared to etching of insulators, copper interconnects are generally formed by a damascene process.

In one connection process, which is called a "dual damascene" technique, two channels of conductive materials, are positioned in vertically separated planes perpendicular to each other and interconnected by a vertical "via" at their closest point.

The first channel part of the dual damascene process starts with the placement of a first channel dielectric layer, which is typically an oxide layer, over the semiconductor devices. A first damascene step photoresist is then placed over the oxide layer and is photolithographically processed to form the pattern of the first channels. An anisotropic oxide etch is then used to etch out the channel oxide layer to form the first channel openings. The damascene step photoresist is stripped and an optional thin adhesion layer is deposited to coat the walls of the first channel opening to ensure good adhesion and electrical contact of subsequent layers to the underlying semiconductor devices. A barrier layer is then deposited on the adhesion layer improve the formation of subsequently deposited conductive material and to act as a barrier material to prevent diffusion of such conductive material into the oxide layer and the semiconductor devices. A first conductive material is then deposited and subjected to a chemical-mechanical polishing process which removes the first conductive material above the first channel oxide layer and damascenes the first conductive material in the first channel openings to form the first channels.

The via formation step of the dual damascene process starts with the deposition of a thin stop nitride over the first channel and the first channel oxide layer. Subsequently, a separating oxide layer is deposited on the stop nitride. This is followed by deposition of a thin via nitride. Then a via step photoresist is used in a photolithographic process to designate round via areas over the first channels.

A nitride etch is then used to etch out the round via areas in the via nitride. The via step photoresist is then removed, or stripped. A second channel dielectric layer, which is typically an oxide layer, is then deposited over the via nitride and the exposed oxide in the via area of the via nitride. A second damascene step photoresist is placed over the second channel oxide layer and is photolithographically processed to form the pattern of the second channels. An anisotropic oxide etch is then used to etch the second channel oxide layer to form the second channel openings and, during the same etching process to etch the via areas down to the thin stop nitride layer above the first channels to form the via openings. The damascene photoresist is then removed, and a nitride etch process removes the nitride above the first channels in the via areas. An adhesion layer is then deposited to coat the via openings and the second channel openings. Next, a barrier layer is deposited on the adhesion layer. This is followed by a deposition of the second conductive material in the second channel openings and the via openings to form the second channel and the via. A second chemical mechanical polishing process leaves the two vertically separated, horizontally perpendicular channels connected by cylindrical vias.

The use of the dual damascene technique eliminates metal etch and dielectric gap fill steps typically used in the metallization process. The elimination of metal etch steps is important as the semiconductor industry moves from aluminum to other metallization materials, such as copper, which are very difficult to etch.

Improvements in circuit speed gained by moving from aluminum to copper have been quite beneficial as circuit speeds have increased by moving the working frequency into the range of about 1 GHz. However, development of integrated circuits having a working frequency in the range from 5 to 50 GHz requires even lower RLC delay interconnections than can be provided by copper. Thus, there exists a need semiconductor devices having interconnections having an RLC delay significantly lower than that provided by copper.

SUMMARY OF THE INVENTION

The present invention relates to a superconducting damascene interconnect structure for a semiconductor device, and to a method for fabricating the superconducting damascene interconnect structure. Thus, the present invention solves the problem of providing a significantly reduced RLC delay interconnection by replacing the conventional damascene interconnect materials with a superconductor. In addition, the present invention relates to a method of fabricating the superconducting damascene interconnect structure by a series of steps which are simple and conventional, but which avoid known problems associated with formation of damascene interconnects.

Thus, the present invention provides a method of forming a superconducting damascene interconnect structure, including:

forming a cavity in an interlevel dielectric;

forming a barrier layer in the cavity;

forming a seed layer in the cavity over the barrier layer;

filling the cavity by electrodepositing a Y—Ba—Cu alloy; and annealing in oxygen flow to form a Y—Ba—Cu—O superconductor on the barrier layer. In one embodiment, the Y—Ba—Cu—O superconductor has a formula $YBa_2Cu_3O_{7-x}$, wherein $x \leq 0.5$.

In another embodiment, the present invention relates to a method of forming a superconducting damascene interconnect structure, including:

forming a cavity in an interlevel dielectric;

forming a Y—Ba—Cu alloy layer in the cavity;

forming a seed layer in the cavity over the Y—Ba—Cu alloy layer;

filling the cavity by electrodepositing a Y—Ba—Cu alloy fill; and annealing in oxygen flow to form a Y—Ba—Cu—O superconductor on the dielectric.

In another embodiment, the present invention relates to a damascene interconnect in a semiconductor device, including a Y—Ba—Cu—O superconductor formed in a cavity in a dielectric material. In one embodiment, the Y—Ba—Cu—O superconductor has a formula $YBa_2Cu_3O_{7-x}$, wherein $x \leq 0.5$.

Thus, the present invention provides a solution to the problem of providing semiconductor devices having interconnections having an RLC delay significantly lower than that provided by copper. The present invention provides a method for making a device, and a device, having a working frequency in the range from 5 to 50 GHz, which results in lower RLC delay interconnections than can be provided by copper.

DETAILED DESCRIPTION

The method of the present invention may be applied to a semiconductor device as a dual damascene or single damascene process. In one embodiment, the process is applied as a dual damascene process, in which the same metal is used for vias and overlying interconnect lines, and both via and line dielectrics are deposited before trench formation and filling. In a single damascene process, vias are formed before deposition of a line dielectric and subsequent trench formation and filling to create interconnect lines. Vias and lines may be formed from different dielectrics in single damascene processes. The same structure or different structures may be obtained by these processes. The method of the present invention is described in terms of a dual damascene process. However, as will be understood by those of skill in the art, the method is applicable to a single damascene process. Thus, as used herein, the term "damascene" refers to both a single damascene process and a dual damascene process.

As used herein, the term "cavity" may refer to either or both of a via or a channel for an interconnect, and any similar structure in which a damascene interconnect may be formed. The channel may also be referred to as a trench before it is filled with a conductive material to form a channel. Thus, when the term "cavity" is used, it is understood that either or both of these terms may be intended. When specific reference to either such term, or to other terms encompassed by the term cavity is intended, such structure will be specifically identified.

FIRST EMBODIMENT: SEMICONDUCTOR DEVICE

In a first embodiment, the present invention relates to a semiconductor device including a damascene superconducting interconnect. In one embodiment, the damascene superconducting interconnect is formed of a Y—Ba—Cu—O superconducting material. In one embodiment, the Y—Ba—Cu—O superconducting material has a chemical formula $YBa_2Cu_3O_{7-x}$, wherein $x \leq 0.5$.

Figure 1:
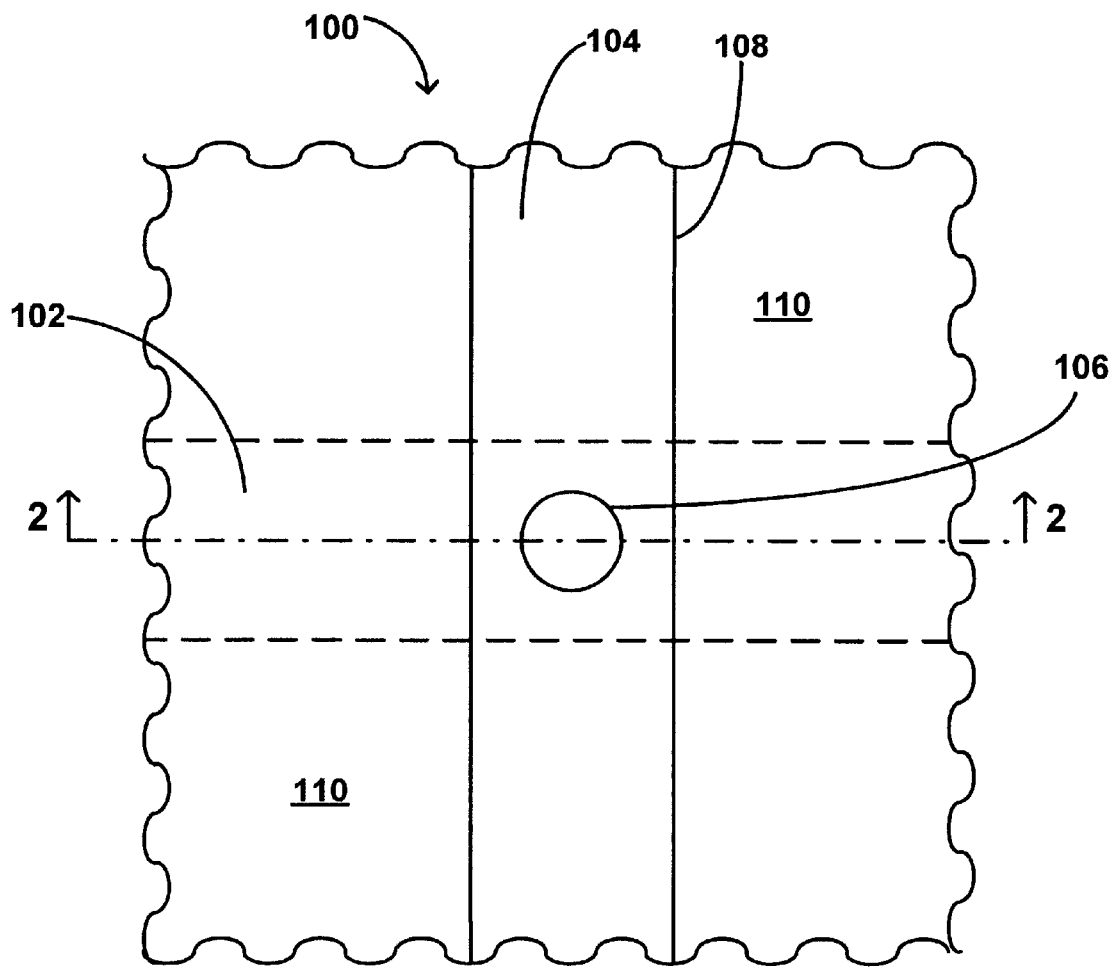
FIG. 1, is a plan view of an embodiment of a superconducting damascene interconnect, in accordance with the present invention.

Referring first to FIG. 1, therein is shown a plan view of a pair of aligned semiconductor damascene channels of a conductive material such as aluminum, copper, tungsten, polysilicon or, in the present invention, a superconductor material, disposed over a production semiconductor wafer 100. A first damascene channel 102 is shown disposed below a second damascene channel 104 which extends substantially perpendicular to the first channel 102 in the plan view. Similarly, a round via 106 connects the first and second damascene channels 102 and 104 and is a part of the second damascene channel 104. In one embodiment, the via 106 is an integral part of the second damascene interconnect channel 104, the via 106 and the second channel 104 being formed as a single structure. The first damascene channel 102 comprises a first conductive material. In one embodiment, the first conductive material is the Y—Ba—Cu—O superconducting material in accordance with the present invention. The second damascene channel 104 is formed by filling a second channel opening 108 disposed in a second channel dielectric layer 110 with a second conductive material. In one embodiment, the second conductive material is the Y—Ba—Cu—O superconducting material in accordance with the present invention.

Figure 2:
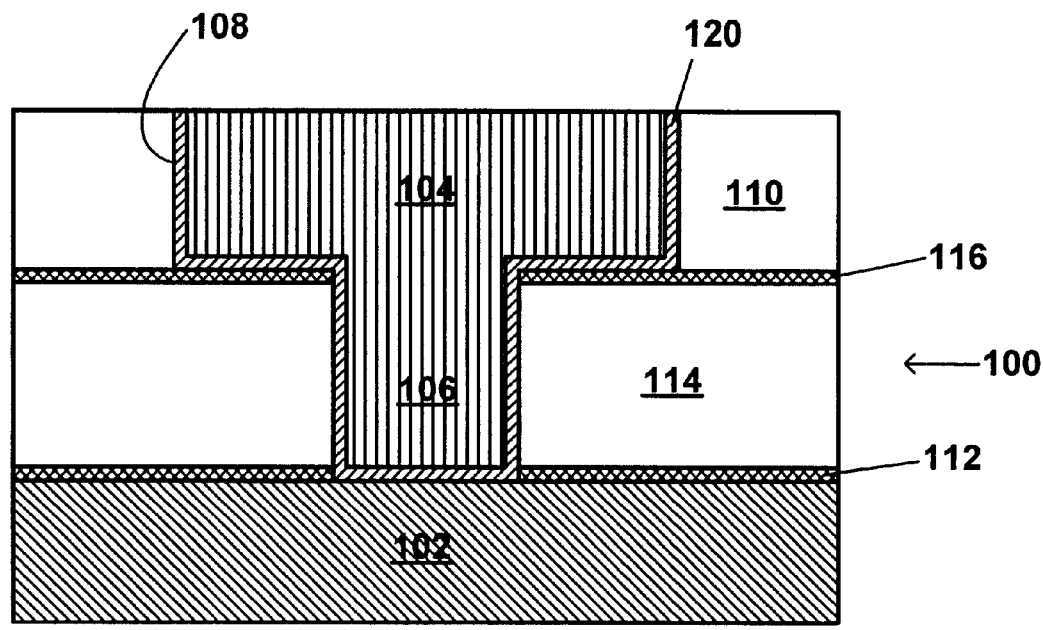
FIG. 2 is a partial cross-sectional view of one embodiment of a superconducting damascene interconnect, taken at line 2—2 of FIG. 1, in accordance with a first embodiment of the present invention.

Referring now to FIG. 2, therein is shown a cross-section, taken along a line 2—2 in FIG. 1, of a semiconductor device 100 in accordance with a first embodiment of the present invention. The first damascene channel 102 may be disposed over active circuit elements such as, e.g., a polysilicon gate and a dielectric of a semiconductor device on an integrated circuit chip (not shown). The first and second damascene channels 102 and 104 are in horizontal planes separated vertically by a stop nitride layer 112, a via dielectric layer 114, and a thin via nitride layer 116. One or more of these layers may be referred to as an interlevel dielectric. The cross-sectional area of the round via 106 of FIG. 1 forms a cylindrical via when it is filled with the second conductive material.

Also shown in the semiconductor device 100 of the embodiment of FIG. 2, disposed around the second damascene channel 104 and the via 106, is a barrier layer 120. The barrier layer 120 separates the second channel 104 and the via 106 from the second channel dielectric layer 110 and the via dielectric layer 114, respectively, and thus from the remainder of the semiconductor device 100. The barrier layer 120 provides insulation between the material of the second channel 104 and the via 106 and the second channel dielectric layer 110 and the via dielectric layer 114, respectively. The barrier layer 120 may act to prevent diffusion, migration or electromigration of metals such as copper from the channel 104 and the via 106 into the adjacent dielectric layers.

The barrier layer 120 may be formed from one or more of Ta, TaN, TaSiN, TiSiN, TiW, or WN or similar materials known in the art. The barrier materials may also include cobalt (Co), nickel (Ni), and palladium (Pd), molybdenum (Mo) and tungsten (W). The barrier may be formed of an alloy, for example, alloys such as NiW, NiTa, NiMo, CoW, CoTa, CoMo, PdW, PdTa, and PdMo.

The barrier layer 120 should be electrically conductive, so as to provide electrical connection between the second channel 104 and the underlying first channel 102. The barrier layer 120 may also promote adhesion of the Y—Ba—Cu—O superconductor material to the material of the adjacent dielectric materials.

Figure 3:
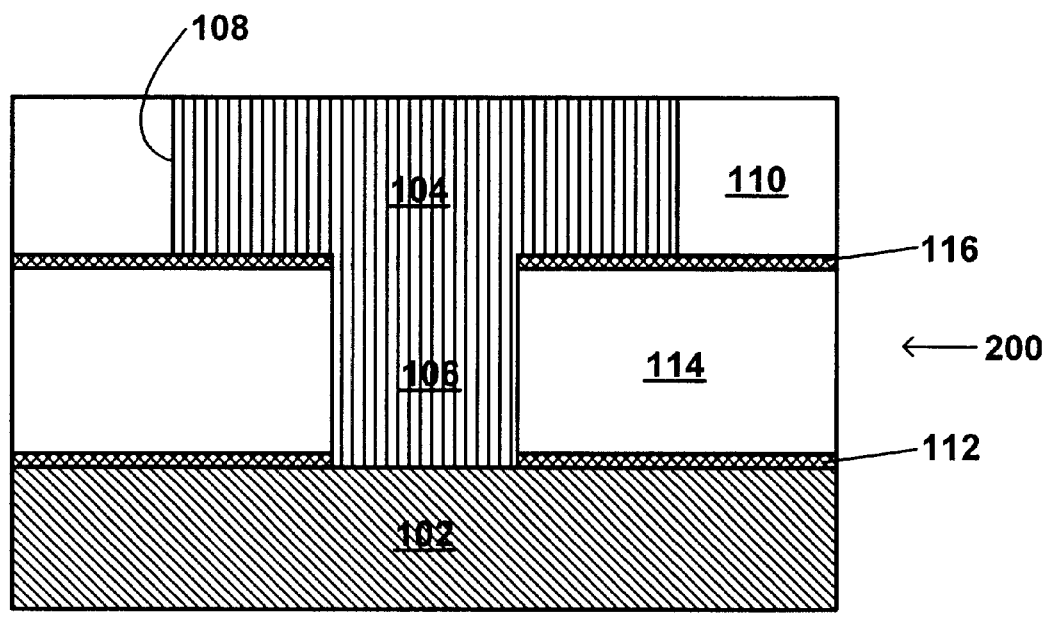
FIG. 3 is a partial cross-sectional view of another embodiment of a superconducting damascene interconnect, taken at line 2—2 of FIG. 1, in accordance with a second embodiment of the present invention.

Referring now to FIG. 3, therein is shown a cross-section, taken along a line 2—2 in FIG. 1, of a semiconductor device 200 in accordance with a second embodiment of the present invention. This embodiment is similar to the embodiment of FIG. 2 except that it does not include a barrier layer. As in the first embodiment, in the second embodiment, the first damascene channel 102 may be disposed over active circuit elements such as, e.g., a polysilicon gate and a dielectric of a semiconductor device on an integrated circuit chip (not shown). The first and second damascene channels 102 and 104 are in horizontal planes separated vertically by a stop nitride layer 112, a via dielectric layer 114, and a thin via nitride layer 116. The cross-sectional area of the round via 106 of FIG. 1 forms a cylindrical via when it is filled with the second conductive material.

In the second embodiment, shown in FIG. 3, the semiconductor device 200 does not require a barrier layer. In one embodiment, the Y—Ba—Cu—O superconducting material does not include species which may migrate, move or diffuse into the adjacent ILD. In one embodiment, the adjacent ILD is formed of a material, such as a low-k dielectric material, which is not susceptible to migration, movement or diffusion of conductive atoms from the adjacent damascene interconnect or channel.

In the embodiments shown in FIGS. 2 and 3, each of the first damascene channel 102 and the second damascene channel 104 and the cylindrical via 106 may comprise a superconductor material, as described more fully below. The embodiments shown in FIGS. 2 and 3 may include a Y—Ba—Cu—O superconductor formed in either or both of the damascene channels 102 and 104 and the via 106. In one embodiment, both of the damascene channels 102 and 104, and the via 106, comprise a Y—Ba—Cu—O superconductor.

In one embodiment, damascene channels 102, 104 and the via 106 are formed of a Y—Ba—Cu—O superconductor having a formula $YBa_2Cu_3O_{7-x}$, wherein $x \leq 0.5$. When x is in this range, the Y—Ba—Cu—O superconductor has a high critical temperature, Tc. In one embodiment, the Tc is about 60° K. to about 92° K. In one embodiment, the Y—Ba—Cu—O superconductor is formed by a method which includes filling the cavity by first depositing a Y—Ba—Cu alloy and annealing the Y—Ba—Cu alloy in an oxygen flow to form the Y—Ba—Cu—O superconductor. This process is described in greater detail hereinbelow.

In one embodiment, the via dielectric layer 114 and the second channel dielectric layer 110 are formed of a conventional dielectric material, such as silicon dioxide, silicon nitride, or silicon oxynitride. In another embodiment, the via dielectric layer 114 and the second channel dielectric layer 110 are formed of a low-k dielectric. A low-k dielectric is a dielectric material which exhibits a dielectric constant substantially less than conventional dielectric materials. Silicon dioxide has a dielectric constant, k, of about 3.9–4.0. Air has a dielectric constant of 1. A low-k dielectric material has a dielectric constant, k, in the range from about 1.1 to about 3.8. In one embodiment, the low-k dielectric material is a plastic-type polymer, which has a k value in the range of about 2.0 to about 3.5. In one embodiment, the low-k dielectric material is benzocyclobutane ("BCB"). BCB has a dielectric constant of about 2.7. In another embodiment, the low-k dielectric material is a deposition type and/or spin-on type material having a fluorine component.

With respect to the low-k dielectric materials having a fluorine component, fluorine may be introduced into a standard dielectric deposition process or a standard spin-on process. Examples of low-k fluorine incorporated dielectric materials include for example, fluorosilicate glass (FSG), silicon oxyfluoride ($F_xSiO_y$), hydrogen silsesquioxane, fluorinated polysilicon, poly-phenylquinoxaline, polyquinoline, methysilsesquixane polymer, and fluoropolymide. The low-k dielectric material may be made by replacing silane ($SiH_4$) with $SiF_4$ in a standard film deposition, which results in the production of a low-k F type film in a deposition plasma reaction. The low-k material may also be formed by any deposition from a fluorine containing ambient (i.e., F-containing ambient) such that a fluorine concentration in the range of 3–20 atom percent is achieved. With F-based films, a k value in the range of 3.0–3.8 is achievable, either from a deposition type formation or a spin-on type formation.

The low-k material may also be organic. Exemplary organic low-k materials include hydrogen silsesquioxane, fluorinated polyimide, poly-phenylquinoxaline, polyquinoline, and methysilsesquixanepolymer.

Air-gap technology may also be used to lower the dielectric constant, k, between superconducting interconnect structures. This technology may include removal of dielectric material between interconnect lines to form air gaps having a k value of 1.

SECOND EMBODIMENT - METHOD 1

Figure 14:
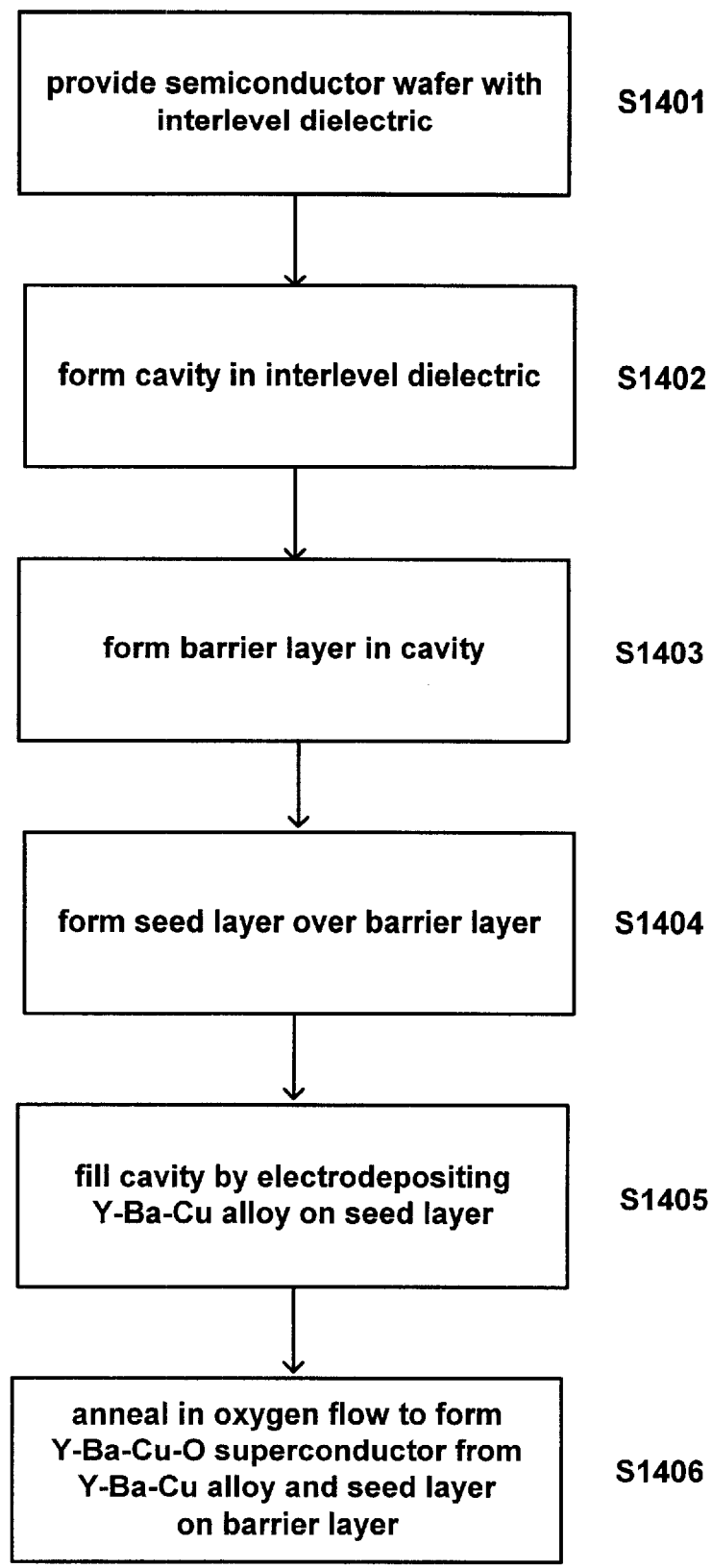
FIG. 14 is a flow diagram of a method of fabrication of a first embodiment of a superconductor damascene interconnect.

In one embodiment, the present invention relates to a method of forming a superconducting damascene interconnect structure, including the steps of forming a cavity in an interlevel dielectric; forming a barrier layer in the cavity; forming a seed layer in the cavity over the barrier layer; filling the cavity by electrodepositing a Y—Ba—Cu alloy; and annealing in oxygen flow to form a Y—Ba—Cu—O superconductor on the barrier layer. Pertinent details of this method to fabricate the device shown in FIG. 2 are set forth in the following, with reference to FIGS. 4–9 and 14. FIG. 14 is a process flow diagram of the steps of the method of this embodiment as outlined here.

As the first step of the method, a semiconductor device 100 is provided, as shown in Step S1401 in FIG. 14. Included in this step, the first channel 102 in a first channel oxide layer (not shown) above portions of a semiconductor device (not shown) is put down using a first damascene process over a production semiconductor wafer 100. The damascene process is a photolithographic process which uses a mask to define a first channel opening (not shown) in the first channel oxide layer. The first channel opening is then filled with the optional adhesion, barrier, and conductive material. The stop nitride layer 112, the via dielectric layer 114, and the via nitride layer 116 would be successively deposited on top of the conductive material in the first channel 102 and the first channel oxide layer using deposition techniques such as those described hereinbelow in more detail with respect to the second channel 104.

Figure 4:
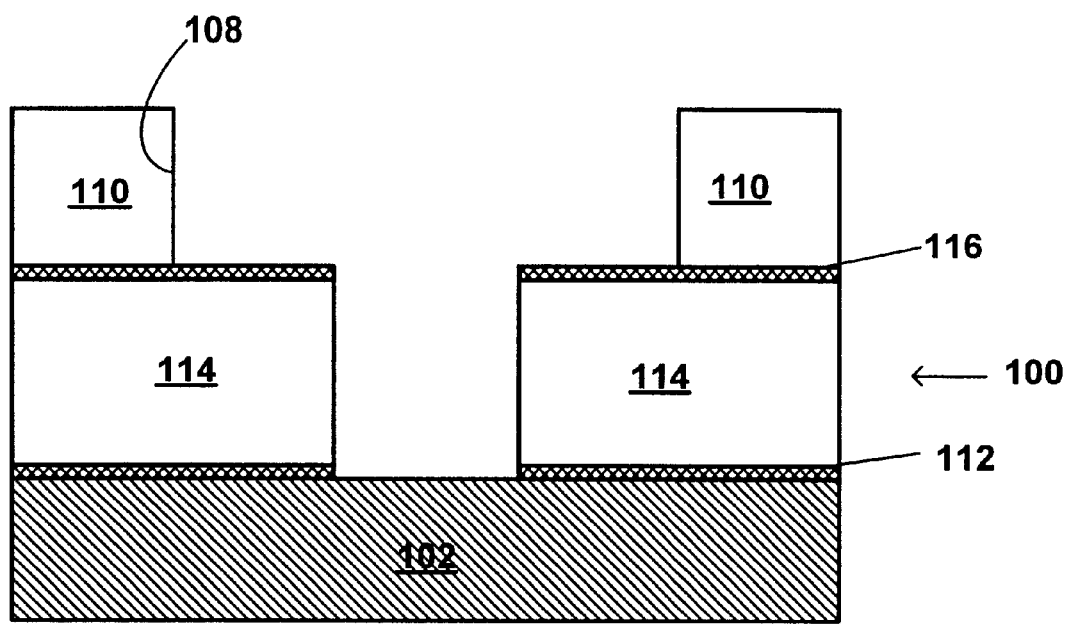
FIG. 4 is a partial cross-sectional view of a cavity for an interconnect formed in a dielectric, in accordance with the first embodiment of the present invention.

Referring to FIG. 4, by using the via photoresist and the via photolithographic process followed by nitride etching of a round via opening 106 in the via nitride layer 116, the basis for the cylindrical via 106 was formed. The subsequent deposition of the second channel dielectric layer 110 prepared the way for the second channel 104 to be perpendicular to the first channel 102.

As shown in FIG. 4 and as Step S1402 in FIG. 14, a cavity forming the channel 104 and the via 106 is formed next. The second damascene process is a photolithographic process which uses a mask to define the second channel opening 108 in the second channel dielectric layer 110. Since the second damascene process uses an anisotropic etch of the dielectric material, the etch also forms the cylindrical via opening 106 down to the stop nitride layer 112. The anisotropic oxide etch etches faster in the vertical direction of FIGS. 2 and 3 than in the horizontal direction. The nitride etch of the stop nitride layer 112 exposes a portion of the first channel conductive material 102 and completes the etching steps, as shown in FIG. 4.

The step of forming a cavity, such as the second channel 104 and the via 106 in an interlevel dielectric such as the second channel dielectric layer 110 and the via dielectric layer 114 may be carried out by any method known in the art for forming such a cavity in a dielectric material. The present invention is not limited to any particular method of cavity formation. The cavity may be formed using photolithographic patterning processes and anisotropic dry etching processes. There are several variations of patterning/etching sequences which may be used to form the cavity. For example, the second channel 104 may be patterned and etched first, followed by patterning and etching of the via 106. Alternatively, with appropriate patterning, both upper and lower parts of the trench may be etched in one step.

Figure 5:
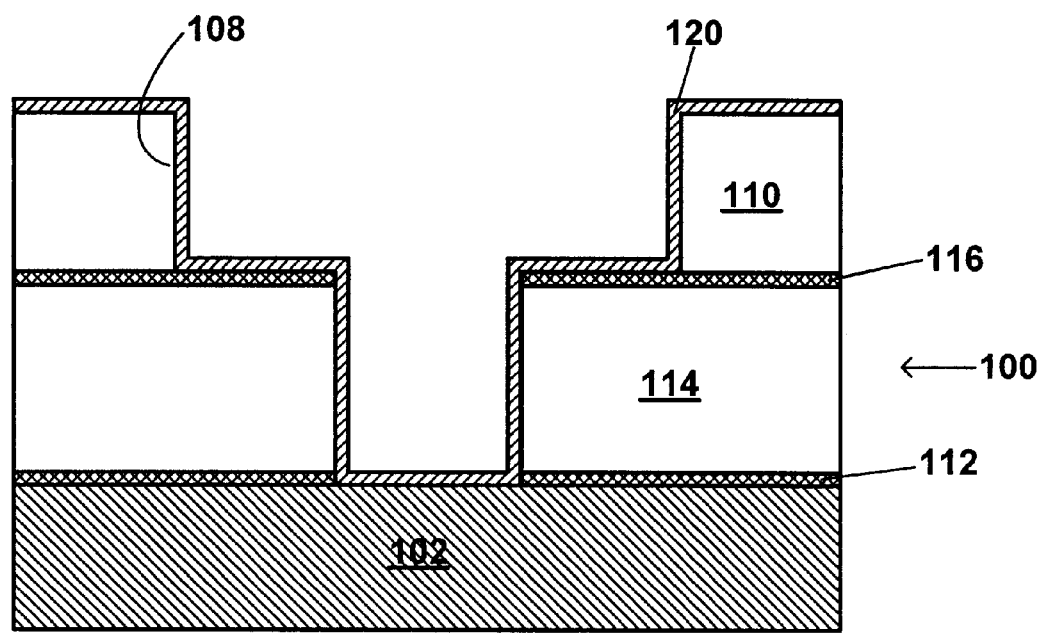
FIG. 5 is a partial cross-sectional view of a cavity for an interconnect formed in a dielectric, with a barrier layer deposited as a cavity liner, in accordance with the first embodiment of the present invention.

Thereafter, as shown in FIG. 5 and as Step S1403 in FIG. 14, the thin barrier layer 120 is deposited on the second channel dielectric layer 110 and the via dielectric layer 114 in the second channel opening 108 and the cylindrical via opening 106. The materials from which the barrier layer 120 may be formed include those disclosed above, and any other equivalent material known in the art. In one embodiment, the barrier layer 120 is deposited directly onto the second channel dielectric layer 110 and the via dielectric layer 114 in the second channel opening 108 and the cylindrical via opening 106, with no intervening materials.

Various metal deposition techniques can be used for the deposition of the barrier layer materials, such techniques include but are not limited to physical vapor deposition, chemical vapor deposition, electroless deposition, electroplating, ion-metal plasma (IMP), hollow cathode magnetron (HCM), sputtering, atomic layer deposition (ALD) or a combination thereof.

In one embodiment, the thickness of the barrier layer is from about 5 mn to about 50 nm. In another embodiment, the thickness of the barrier layer is from about 10 nm to about 30 nm.

Figure 6:
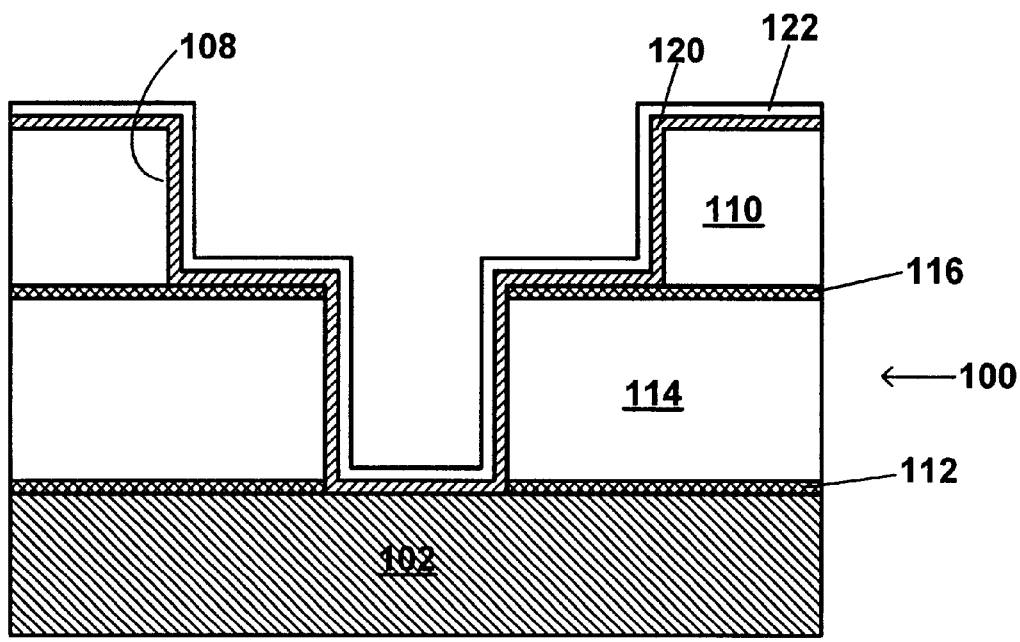
FIG. 6 is a partial cross-sectional view of a cavity for an interconnect formed in a dielectric, with a seed layer formed on a barrier layer, in accordance with the first embodiment of the present invention.

Next, as shown in FIG. 6 and as Step S1404 in FIG. 14, a seed layer 122 is a formed over the barrier layer 120. The seed layer 122 may be a metal such as copper, copper-silver alloy, silver, or another highly conductive metal. In one embodiment, the seed layer 122 is copper. In one embodiment, a copper-silver alloy, and in another embodiment, silver. In other embodiments, the seed layer may be a metal such as gold, palladium, platinum, or alloys of any of the above metals. In one embodiment, the seed layer becomes an integral, chemically-reacted part of the superconductor material during subsequent annealing steps, as described more fully below. In another embodiment, a first portion of the seed layer becomes an integral, chemically reacted part of the superconductor material during subsequent annealing steps, while a remaining portion does not so react and thereby retains its character substantially as deposited, as described more fully below.

The seed layer 122 may be deposited by any of the techniques noted above for deposition of the barrier layer 120. In one embodiment, the seed layer 122 is deposited by electrodeposition. In one embodiment, the seed layer 122 is deposited by electroless deposition. The seed layer 122 may be quite thin. In one embodiment, the seed layer 122 is deposited to a thickness of about 1 nm to about 50 nm. In one embodiment, the seed layer 122 is deposited to a thickness of about 5 nm to about 20 nm. In another embodiment, the seed layer 122 is deposited to a thickness of about 1 nm to about 5 mn. In one embodiment, the seed layer 122 is deposited directly onto the barrier layer 120, with no intervening materials.

Figure 7:
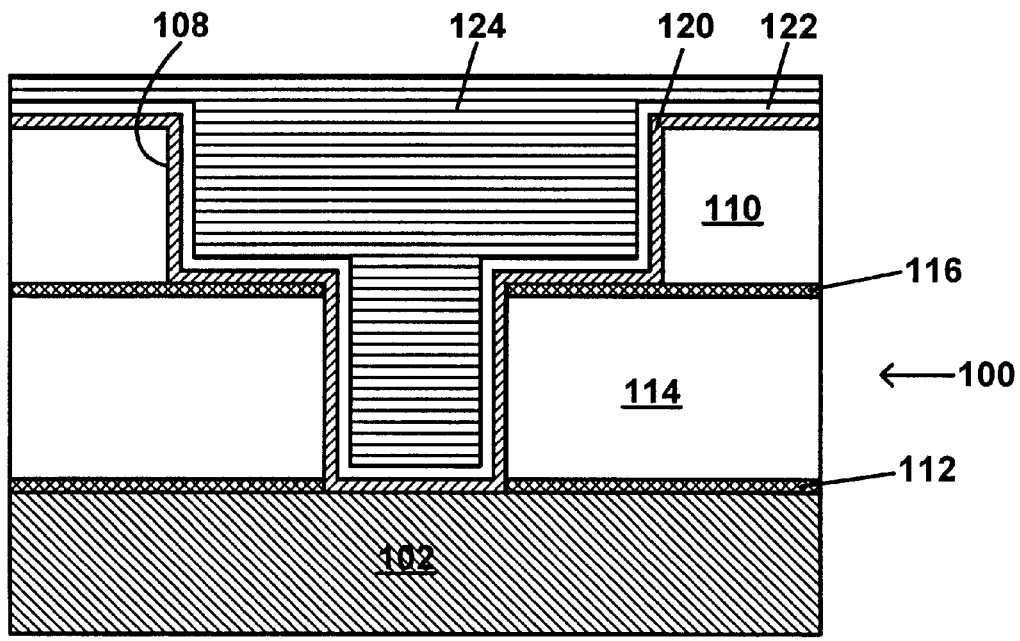
FIG. 7 is a partial cross-sectional view of a filled cavity for an interconnect formed in a dielectric, with a seed layer formed on a barrier layer, and the cavity filled with a superconductor precursor, in accordance with the first embodiment of the present invention.

Next, as shown in FIG. 7 and as Step S1405 in FIG. 14, a material 124 which will eventually form the superconductor material is deposited into the second channel opening 104 and via opening 106. In one embodiment, the material 124 is a Y—Ba—Cu alloy. In one embodiment, the Y—Ba—Cu alloy layer 124 is formed by laser ablation, CVD or sputtering. In another embodiment, the Y—Ba—Cu alloy 124 is deposited by electrodeposition. In other embodiments, the Y—Ba—Cu alloy 124 is deposited using other conventional metal deposition techniques, such as those identified above for deposition of the barrier layer 120.

In depositing the Y—Ba—Cu alloy 124 onto the seed layer 122, which is in turn formed on the barrier layer 120, the Y—Ba—Cu alloy 124 forms a layer over the surface of the semiconductor device 100, as shown in FIG. 7. In one embodiment, the Y—Ba—Cu alloy 124 is deposited directly onto the seed layer 122, with no intervening materials.

Figure 8:
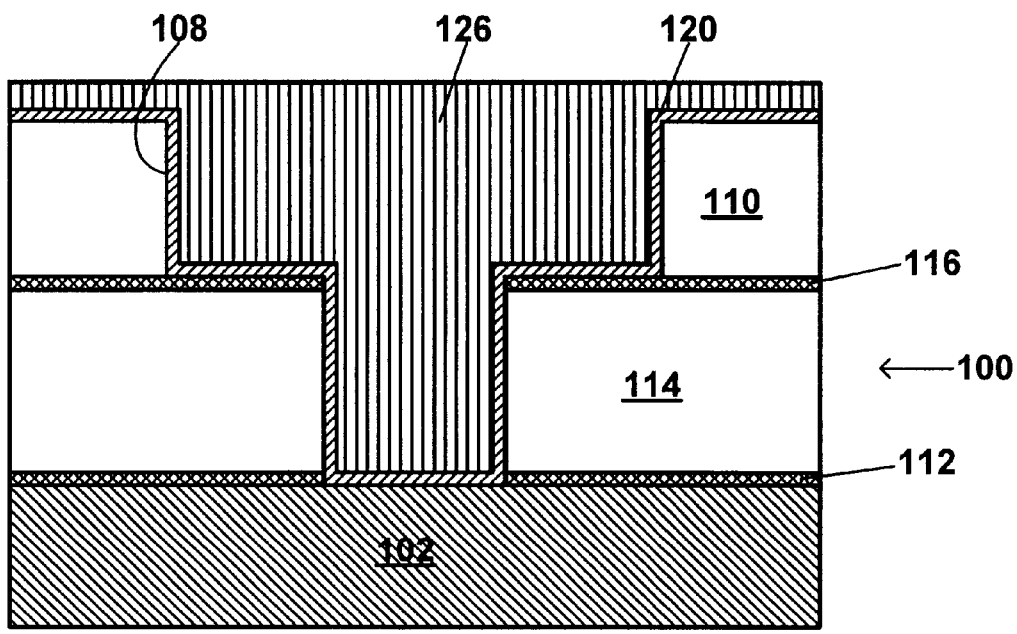
FIG. 8 is a partial cross-sectional view of a filled cavity for an interconnect, following an annealing step, with a barrier layer remaining, and with the cavity filled with a superconductor, in accordance with the first embodiment of the present invention.
Figure 9:
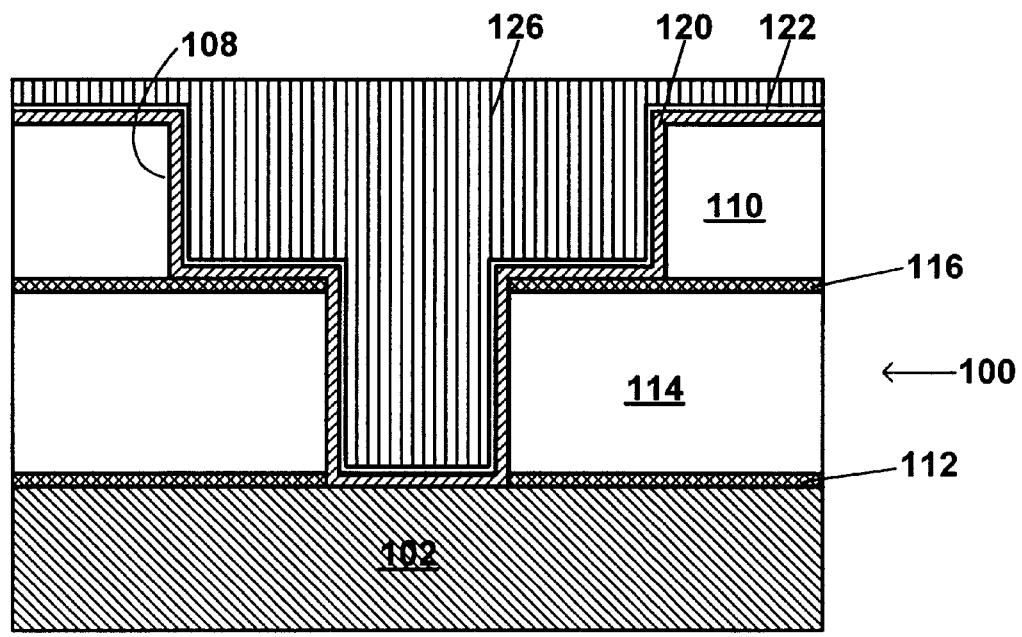
FIG. 9 is a partial cross-sectional view of a another embodiment of a filled cavity for an interconnect, following an annealing step, with a barrier layer and a portion of a seed layer remaining, and with the cavity filled with a superconductor, in accordance with the first embodiment of the present invention.

As shown in FIGS. 8 and 9, with the Y—Ba—Cu layer 124 in place in the second channel 104 and the via 106, the semiconductor device is subjected to annealing in an oxygen flow, to form a Y—Ba—Cu—O superconductor material 126 from the Y—Ba—Cu layer 124 and at least a portion of the seed layer 122.

The annealing step is carried out in an oxygen flow, in which the oxygen may be provided as ozone, $O_3$, or as oxygen, $O_2$. The ozone may be generated in situ, or provided from an external source. In an embodiment in which ozone, $O_3$, is provided as the source of oxygen flow, the annealing temperature may be reduced as compared to when oxygen, $O_2$, is used. In one embodiment, the oxygen provided includes at least a portion of the oxygen in the form of singlet oxygen, $^1O\bullet$. The singlet oxygen may be generated from any known source, such as application of high energy, short wavelength UV radiation to a stream of oxygen.

The annealing conditions include exposure to the oxygen flow at temperatures in the range from about 400° C. to about 900° C. for periods of time ranging from about 10 minutes to about 1000 minutes. In one embodiment, the annealing temperature is in the range from about 500° C. to about 800° C., and in another from 600° C. to about 700° C. In one embodiment, the annealing time is in the range from about 90 minutes to about 600 minutes. In one embodiment, the annealing time is in the range from about 150 to about 450 minutes. In another embodiment, the annealing time is in the range from about 180 to about 420 minutes. In another embodiment, the annealing time is in the range from about 240 to about 360 minutes, and in one embodiment, from about 240 to about 300 minutes. With respect to all rates, ratios and ranges disclosed herein, the limits of the rates, ratios and ranges may be combined or interchanged.

The step of annealing in an oxygen flow converts the Y—Ba—Cu alloy 124 and a portion of the seed layer 122 into a Y—Ba—Cu—O superconductor material 126. In the annealing step, the oxygen provided by the oxygen flow reacts with the Y—Ba—Cu alloy 124 and the seed layer 122, to form the Y—Ba—Cu—O superconductor material 126, as shown in FIG. 8. In one embodiment, the Y—Ba—Cu—O superconductor material has a formula $YBa_2Cu_3O_{7-x}$, wherein $x \leq 0.5$.

In one embodiment, the step of annealing in an oxygen flow converts the Y—Ba—Cu alloy 124 and substantially all of the seed layer 122 into a Y—Ba—Cu—O superconductor material 126, as shown in FIG. 8. In another embodiment, annealing in an oxygen flow converts the Y—Ba—Cu alloy 124 and only a portion of the seed layer 122 into a Y—Ba—Cu—O superconductor material 126, thus leaving a thin seed layer 122 between the superconductor material 126 and the barrier layer 120, as shown in FIG. 9.

Thereafter, a chemical mechanical polishing process is used to complete the process by removing excess superconductor material 126 from the upper surface of the semiconductor wafer 100, to obtain the semiconductor device shown in FIG. 2, in which the Y—Ba—Cu—O superconductor material 126 forms the second channel 104.

As noted above, although not separately described, the same process may be used to form the first channel 102 of a Y—Ba—Cu—O superconductor material by essentially the same steps as described herein, except that it may be unnecessary to form a via.

THIRD EMBODIMENT: METHOD 2

Figure 15:
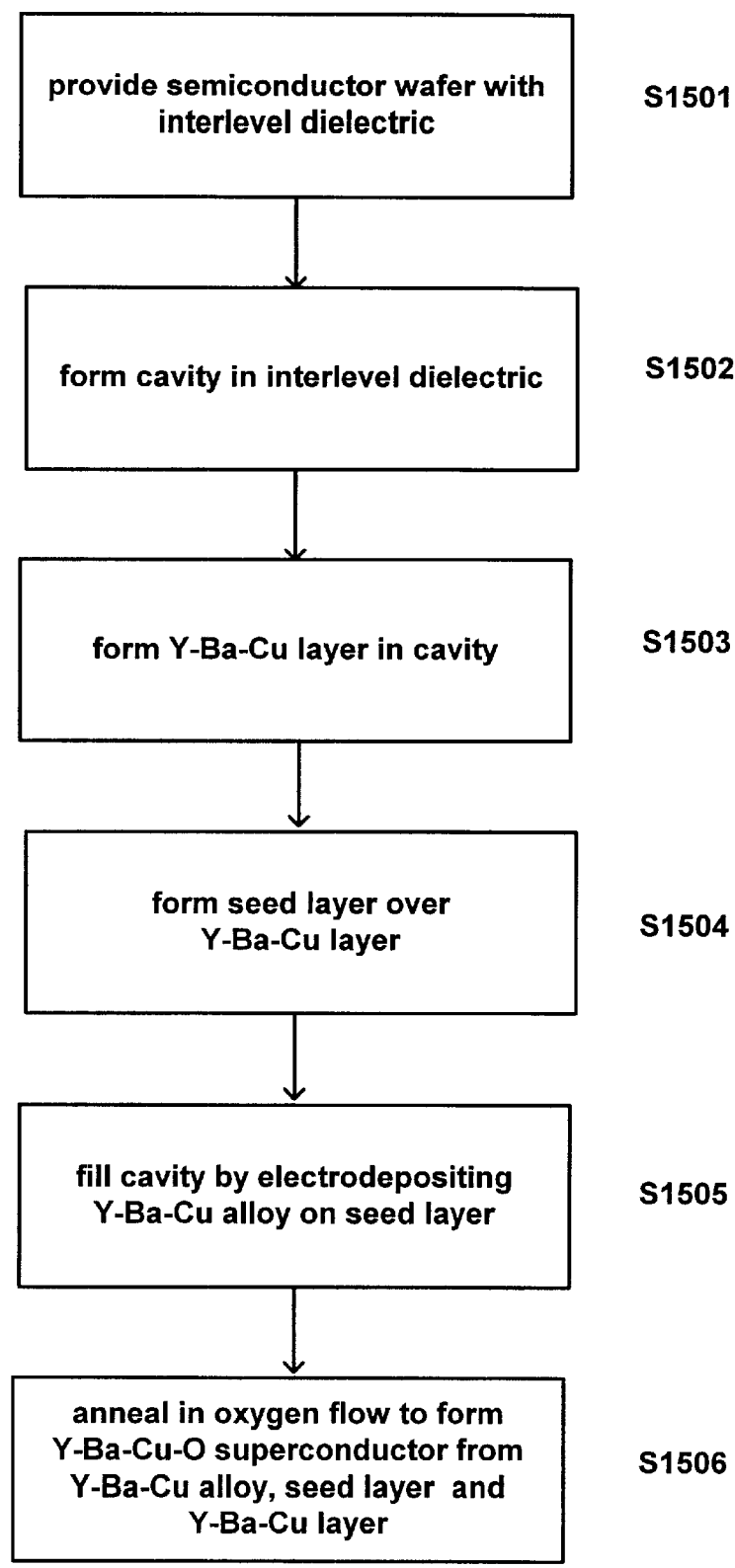
FIG. 15 is a flow diagram of a method of fabrication of a second embodiment of a superconductor damascene interconnect.

A method of forming a superconducting damascene interconnect structure, including the steps of forming a cavity in an interlevel dielectric; forming a Y—Ba—Cu alloy layer in the cavity; forming a seed layer in the cavity over the Y—Ba—Cu alloy layer; filling the cavity by electrodepositing a Y—Ba—Cu alloy fill; and annealing in oxygen flow to form a Y—Ba—Cu—O superconductor on the dielectric. Pertinent details of this method to fabricate the device shown in FIG. 3 are set forth in the following, with reference to FIGS. 4, 10–13 and 15. FIG. 15 is a process flow diagram of the steps of the method of this embodiment as outlined here.

In this embodiment, the initial steps, shown as Steps S1501 and S1502 in FIG. 15, are essentially the same as in the previously described embodiment. The semiconductor device 100 is provided in Step S1501. The first channel 102 in a first channel oxide layer (not shown) above portions of a semiconductor device (not shown) is put down using a first damascene process over a production semiconductor wafer 100. The damascene process is a photolithographic process which uses a mask to define a first channel opening (not shown) in the first channel oxide layer. The first channel opening is then filled with the optional adhesion, barrier, and conductive material. The stop nitride layer 112, the via dielectric layer 114, and the via nitride layer 116 would be successively deposited on top of the conductive material in the first channel 102 and the first channel oxide layer using deposition techniques such as those described hereinabove and below in more detail with respect to the second channel 104.

Referring to FIG. 4, by using the via photoresist and the via photolithographic process followed by nitride etching of a round via opening 106 in the via nitride layer 116, the basis for the cylindrical via 106 was formed. The subsequent deposition of the second channel dielectric layer 110 prepared the way for the second channel 104 to be perpendicular to the first channel 102.

As shown in FIG. 4 and in Step S1502 of FIG. 15, the cavity forming the channel 104 and the via 106 is formed next. The second damascene process is a photolithographic process which uses a mask to define the second channel opening 108 in the second channel dielectric layer 110. Since the second damascene process uses an anisotropic etch of the dielectric material, the etch also forms the cylindrical via opening 106 down to the stop nitride layer 112. The anisotropic oxide etch etches faster in the vertical direction of FIGS. 2 and 3 than in the horizontal direction. The nitride etch of the stop nitride layer 112 exposes a portion of the first channel conductive material 102 and completes the etching steps, as shown in FIG. 4.

As noted above, the step of forming a cavity, such as the second channel 104 and the via 106 in an interlevel dielectric such as the second channel dielectric layer 110 and the via dielectric layer 114 may be carried out by any method known in the art for forming such a cavity in a dielectric material. The present invention is not limited to any particular method of cavity formation.

Up to this point, the steps of the second embodiment of the method of the present invention have been the same as in the first embodiment of the method, and the semiconductor device 100 has been the same. Hereafter, the methods diverge, and the semiconductor device is referred to as the semiconductor device 200, since the structure is hereafter different from the semiconductor device 100.

Figure 10:
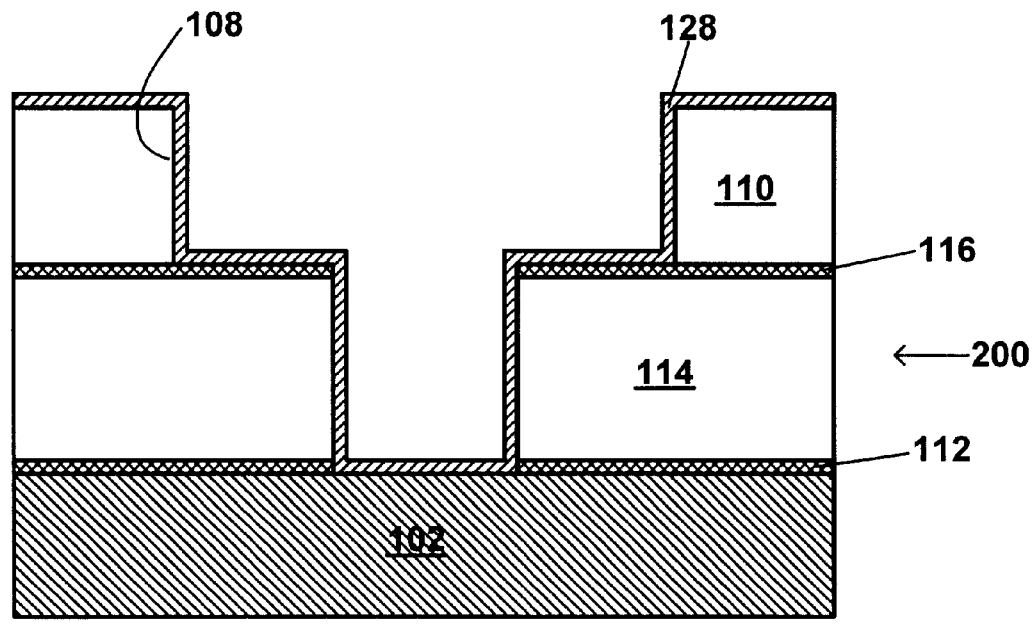
FIG. 10 is a partial cross-sectional view of a cavity for an interconnect formed in a dielectric, with a first superconductor precursor layer deposited as a cavity liner, in accordance with a second embodiment of the present invention.

Next, as shown in FIG. 10 and in Step S1503 of FIG. 15, a base Y—Ba—Cu alloy layer 128 is deposited on the second channel dielectric layer 110 and the via dielectric layer 114 in the second channel opening 108 and the cylindrical via opening 106 in the semiconductor device 200. The base Y—Ba—Cu alloy layer 128 may be formed by a deposition method such as laser ablation, CVD or sputtering. In one embodiment, the base Y—Ba—Cu alloy layer 128 is deposited directly onto the second channel dielectric layer 110 and the via dielectric layer 114 in the second channel opening 108 and the cylindrical via opening 106, with no intervening materials.

Various metal deposition techniques can be used for the deposition of the base Y—Ba—Cu alloy layer 128, such techniques include but are not limited to physical vapor deposition, chemical vapor deposition, electroless deposition, electroplating, ion-metal plasma (IMP), hollow cathode magnetron (HCM), sputtering, atomic layer deposition (ALD) or a combination thereof.

In one embodiment, the thickness of the base Y—Ba—Cu alloy layer 128 is from about 5 nm to about 50 nm. In another embodiment, the thickness of the barrier layer is from about 10 nm to about 30 mn.

Figure 11:
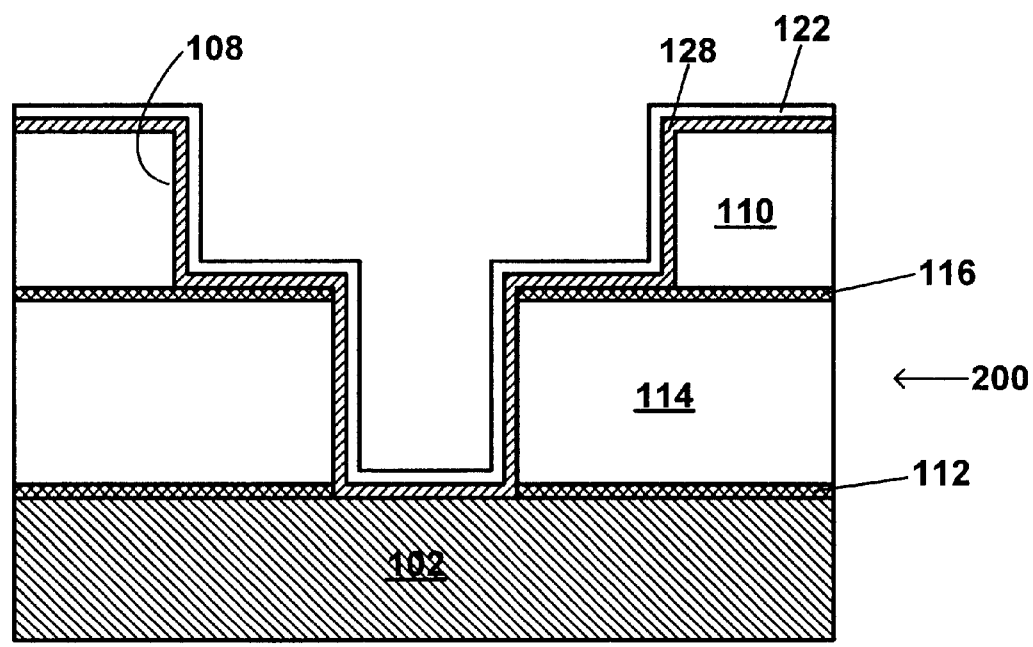
FIG. 11 is a partial cross-sectional view of a cavity for an interconnect formed in a dielectric, with a seed layer formed on a first superconductor precursor layer, in accordance with the second embodiment of the present invention.

Next, as shown in FIG. 11 and in Step S1504 of FIG. 15, a seed layer 122 is formed over the base Y—Ba—Cu alloy layer 128 of the semiconductor device 200. The seed layer 122 may be a metal such as copper, copper-silver alloy, silver, or other highly conductive metals. In one embodiment, the seed layer 122 is copper. In one embodiment, the seed layer 122 comprises copper, e.g., copper included in an alloy or a mixture. In one embodiment, the seed layer 122 is a copper-silver alloy, and in another embodiment, the seed layer 122 comprises silver. In other embodiments, the seed layer 122 may be or comprise a metal such as gold, palladium, platinum, or alloys of any of the above metals. In one embodiment, the seed layer 122 becomes an integral, chemically reacted part of the superconductor material during subsequent annealing steps, as described more fully below. In another embodiment, a portion of the seed layer 122 becomes an integral, chemically reacted part of the superconductor material during subsequent annealing steps, while a remaining portion of the seed layer 122 does not so react and thereby retains its character substantially as deposited, as described more fully below. The seed layer 122 in this embodiment may be the same as or different from the seed layer 122 described above for the first embodiment.

The seed layer 122 may be deposited by any of the techniques noted above for deposition of the base Y—Ba—

Cu alloy layer 128. In one embodiment, the seed layer 122 is deposited by electrodeposition. The seed layer 122 may be quite thin. In one embodiment, the seed layer 122 is deposited to a thickness of about 1 nm to about 50 nm. In one embodiment, the seed layer 122 is deposited to a thickness of about 5 nm to about 20 nm. In another embodiment, the seed layer 122 is deposited to a thickness of about 1 nm to about 5 nm. In one embodiment, the seed layer 122 is deposited directly onto the barrier layer 120, with no intervening materials.

Figure 12:
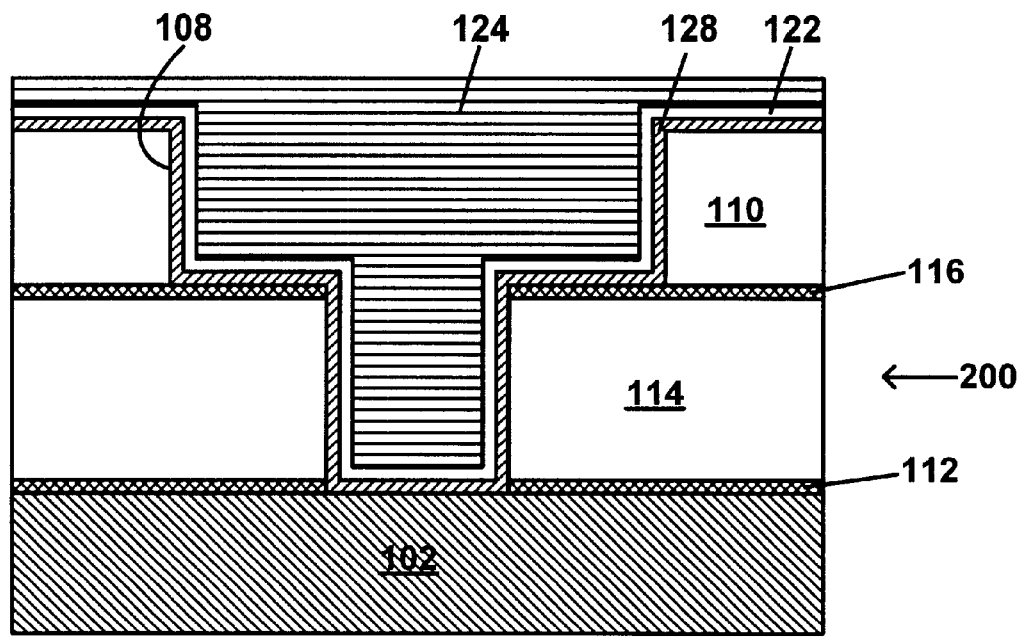
FIG. 12 is a partial cross-sectional view of a filled cavity for an interconnect formed in a dielectric, with a seed layer formed on a first layer of a superconductor precursor, and the cavity filled with the superconductor precursor, in accordance with the second embodiment of the present invention.

Next, as shown in FIG. 12 and as Step S1505 in FIG. 15, a material 124 which will eventually form the superconductor material is deposited into and fills the second channel opening 104 and via opening 106. In one embodiment, the material 124 is a Y—Ba—Cu alloy fill. In one embodiment, the Y—Ba—Cu alloy fill 124 is formed by laser ablation, CVD or sputtering. In another embodiment, the Y—Ba—Cu alloy fill 124 is deposited by electrodeposition. In other embodiments, the Y—Ba—Cu alloy fill 124 is deposited using other conventional metal deposition techniques, such as those identified above for deposition of the barrier layer 120.

In depositing the Y—Ba—Cu alloy fill 124 onto the seed layer 122 and filling the channel 104, the Y—Ba—Cu alloy fill 124 forms a layer over the surface of the semiconductor device 100, as shown in FIG. 12. In one embodiment, the Y—Ba—Cu alloy fill 124 is deposited directly onto the seed layer 122, with no intervening materials.

Figure 13:
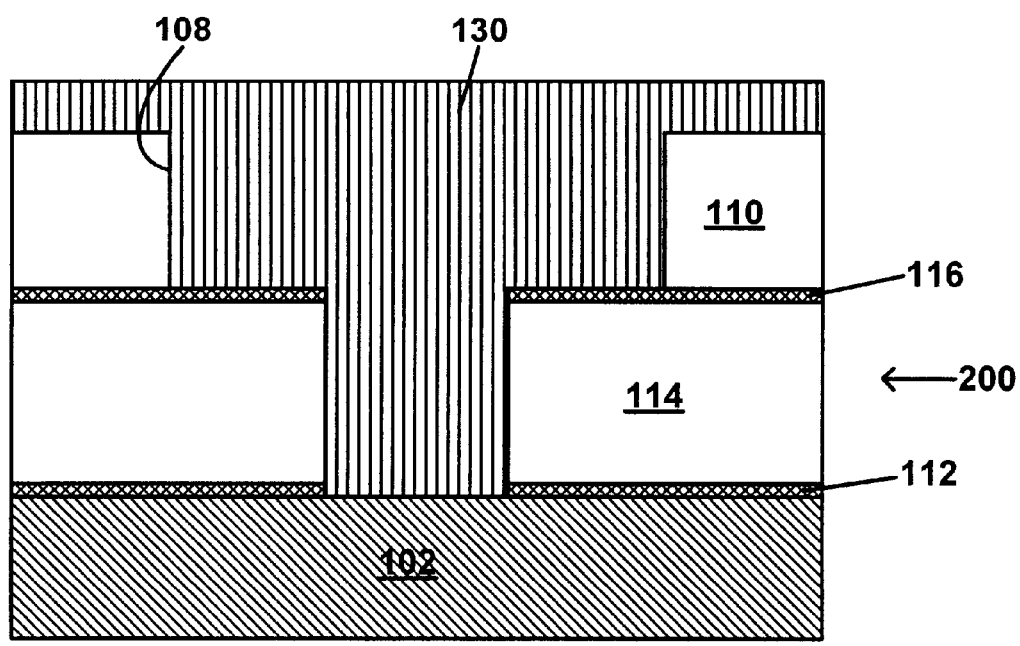
FIG. 13 is a partial cross-sectional view of a filled cavity for an interconnect, following an annealing step, with the cavity filled with a superconductor, in accordance with the second embodiment of the present invention.

As shown in FIG. 13, with the Y—Ba—Cu alloy fill 124 in place in the second channel 104 and the via 106, the semiconductor device 200 is subjected to annealing in an oxygen flow, to form a second Y—Ba—Cu— superconductor material 130 from the Y—Ba—Cu alloy fill 124, the base Y—Ba—Cu alloy layer 128 and the seed layer 122. The annealing step is carried out in an oxygen flow, in which the oxygen is provided as ozone, $O_3$, or as oxygen, $O_2$. The ozone may be generated in situ, or provided from an external source. In one embodiment, the oxygen provided includes at least a portion of the oxygen in the form of singlet oxygen, $^1O\bullet$. The singlet oxygen may be generated from any known source, such as application of high energy, short wavelength UV radiation to a stream of oxygen.

The annealing conditions include exposure to the oxygen at temperatures in the range from about 400° C. to about 900° C. for periods of time ranging from about 10 minutes to about 1000 minutes. In one embodiment, the annealing temperature is in the range from about 500° C. to about 800° C., and in another from 600° C. to about 700° C. In one embodiment, the annealing time is in the range from about 30 minutes to about 150 minutes.

The step of annealing in an oxygen flow converts the Y—Ba—Cu alloy fill 124, the base Y—Ba—Cu alloy layer 128 and the seed layer 122 into a second Y—Ba—Cu—O superconductor material 130. In the annealing step, the oxygen provided by the oxygen flow reacts with the Y—Ba—Cu alloy fill 124, the base Y—Ba—Cu alloy layer 128 and the seed layer 122, to form the Y—Ba—Cu—O superconductor material 130, as shown in FIG. 13. In one embodiment, the Y—Ba—Cu—O superconductor material has a formula $YBa_2Cu_3O_{7-x}$, wherein $x \leq 0.5$.

In this embodiment, the step of annealing in an oxygen flow converts the Y—Ba—Cu alloy fill 124, the base Y—Ba—Cu alloy layer 128 and substantially all of the seed layer 122 into a Y—Ba—Cu—O superconductor material 130, as shown in FIG. 13.

Thereafter, a chemical mechanical polishing process is used to complete the process by removing excess second superconductor material 130 from the upper surface of the semiconductor wafer 100, to obtain the semiconductor device shown in FIG. 3, in which the Y—Ba—Cu—O superconductor material 130 forms the second channel 104, and in which no barrier layer remains between the Y—Ba—Cu—O superconductor material 130 and the adjacent dielectric materials.

As noted above, although not separately described, the same process could be used to form the first channel 102 of a Y—Ba—Cu—O superconductor material by essentially the same steps as described herein.

What has been described above are certain embodiments of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A method of forming a superconducting damascene interconnect structure, comprising:
    forming a cavity in an interlevel dielectric;
    forming a barrier layer in the cavity;
    forming a seed layer in the cavity over the barrier layer;
    filling the cavity by electrodepositing a Y—Ba—Cu alloy; and
    annealing in oxygen flow to form a Y—Ba—Cu—O superconductor on the barrier layer.

2. The method of claim 1, wherein the barrier layer comprises one or more of Ta, TaN, TaSiN, TiSiN, WN, Co, Ni, Pd, Mo, W, NiW, NiTa, NiMo, CoW, CoTa, CoMo, PdW, PdTa, and PdMo.

3. The method of claim 2, wherein the barrier layer is formed by CVD, PVD, HCM, electroless, electroplating, IMP, sputtering, or ALD.

4. The method of claim 1, wherein the seed layer is formed from Cu, a Cu—Ag alloy or Ag.

5. The method of claim 4, wherein the seed layer is formed by electrodeposition or electroless deposition.

6. The method of claim 1, wherein the Y—Ba—Cu layer is formed by laser ablation, CVD or sputtering.

7. The method of claim 1, wherein the step of annealing forms the Y—Ba—Cu—O superconductor from the seed layer and the Y—Ba—Cu layer.

8. The method of claim 1, wherein the Y—Ba—Cu—O superconductor has a formula $YBa_2Cu_3O_{7-x}$, wherein $x \leq 0.5$.

9. A method of forming a superconducting damascene interconnect structure, comprising:
    forming a cavity in an interlevel dielectric;
    forming a Y—Ba—Cu alloy layer in the cavity;
    forming a seed layer in the cavity over the Y—Ba—Cu alloy layer;
    filling the cavity by electrodepositing a Y—Ba—Cu alloy fill; and
    annealing in oxygen flow to form a Y—Ba—Cu—O superconductor on the dielectric.

10. The method of claim 9, wherein the Y—Ba—Cu alloy layer is formed by laser ablation, CVD or sputtering.

11. The method of claim 10, wherein the seed layer is formed from Cu, a Cu—Ag alloy or Ag.

12. The method of claim 11, wherein the seed layer is formed by electrodeposition or electroless deposition.

13. The method of claim 10, wherein the step of annealing forms the Y—Ba—Cu—O superconductor from the Y—Ba—Cu alloy layer, the seed layer, and the Y—Ba—Cu alloy fill.

14. The method of claim 1, wherein the Y—Ba—Cu—O superconductor has a formula $YBa_2Cu_3O_{7-x}$, wherein $x \leq 0.5$.

15. A damascene interconnect in a semiconductor device, comprising a Y—Ba—Cu—O superconductor formed in a cavity in a dielectric material.

16. The superconductor damascene interconnect of claim 15, wherein the damascene interconnect is in electrical contact with a second interconnect.

17. The superconductor damascene interconnect of claim 15, wherein the cavity further comprises a barrier layer between the interconnect and the cavity.

18. The superconductor damascene interconnect of claim 17, wherein the barrier layer comprises one or more of Ta, TaN, TaSiN, TiSiN, WN, Co, Ni, Pd, Mo, W, NiW, NiTa, NiMo, CoW, CoTa, CoMo, PdW, PdTa, and PdMo.

19. The superconductor damascene interconnect of claim 17, wherein the cavity further comprises a seed layer between the interconnect and the barrier layer.

20. The superconductor damascene interconnect of claim 15, wherein the Y—Ba—Cu—O superconductor has a formula $YBa_2Cu_3O_{7-x}$, wherein $x \leq 0.5$.

* * * * *

UNITED STATES PATENT AND TRADEMARK OFFICE
CERTIFICATE OF CORRECTION

PATENT NO. : 6,420,189 B1
DATED : July 16, 2002
INVENTOR(S) : Lopatin

It is certified that error appears in the above-identified patent and that said Letters Patent is hereby corrected as shown below:

Title page,
Item [54], replace "INTERCONNECTED" with -- INTERCONNECT --

Column 1,
Line 46, replace "modem" with -- modern --

Column 9,
Line 41, replace "mn" with -- nm --
Line 45, replace "is a formed" with -- is formed --

Column 10,
Line 4, replace "mn" with -- nm --

Column 12,
Line 41, replace "mn" with -- nm --

Signed and Sealed this

Thirty-first Day of December, 2002

JAMES E. ROGAN
*Director of the United States Patent and Trademark Office*